(12) United States Patent
Ha

(10) Patent No.: US 8,039,942 B2
(45) Date of Patent: Oct. 18, 2011

(54) BALL GRID ARRAY PACKAGE STACKING SYSTEM

(75) Inventor: Jong-Woo Ha, Seoul (KR)

(73) Assignee: Stats Chippac Ltd., Singapore (SG)

( * ) Notice: Subject to any disclaimer, the term of this patent is extended or adjusted under 35 U.S.C. 154(b) by 708 days.

(21) Appl. No.: 12/141,059

(22) Filed: Jun. 17, 2008

(65) Prior Publication Data
US 2009/0309204 A1  Dec. 17, 2009

(51) Int. Cl.
*H01L 23/02* (2006.01)
*H01L 23/34* (2006.01)

(52) U.S. Cl. . 257/686; 257/706; 257/713; 257/E23.101; 257/E23.141

(58) Field of Classification Search ............ 257/686, 257/706, 713
See application file for complete search history.

(56) References Cited

U.S. PATENT DOCUMENTS

| | | | |
|---|---|---|---|
| 6,537,848 B2 | 3/2003 | Camenforte et al. |
| 6,853,070 B2 | 2/2005 | Khan et al. |
| 6,984,785 B1 | 1/2006 | Diao et al. |
| 7,315,079 B2 | 1/2008 | Zhou et al. |
| 2006/0103010 A1 | 5/2006 | Kim et al. |
| 2009/0236733 A1 | 9/2009 | Chow et al. |

*Primary Examiner* — David Zarneke
(74) *Attorney, Agent, or Firm* — Mikio Ishimaru

(57) ABSTRACT

A ball grid array package stacking system includes: providing a base substrate; coupling an integrated circuit to the base substrate; coupling a stacking substrate over the base substrate; mounting a heat spreader, having an access port, around the base substrate and the stacking substrate; and coupling a stacked integrated circuit to the stacking substrate through the access port.

10 Claims, 4 Drawing Sheets

BALL GRID ARRAY PACKAGE STACKING SYSTEM

TECHNICAL FIELD

The present invention relates generally to integrated circuit packaging, and more particularly to a system for enhancing the capabilities of ball grid array packaging.

BACKGROUND ART

A number of different packaging technologies exist for attaching semiconductor devices to a printed circuit board (PCB). Many of today's consumer electronic devices, such as personal video players, video games, and hand held computers require a high density of integrated circuits mounted on the PCB. The three packaging technologies include a ball grid array (BGA), chip scale package (CSP), and direct chip attach (DCA). BGA is an older technology relative to CSP and DCA. Theoretically speaking, the most effective packaging technology is DCA. DCA involves the direct attachment of the chip to the PCB without a package, such as a solder-bumped flip chip or wire bonding chip on the board. Issues with respect to the cost of supplying a known good die (KGD) and corresponding fine line and spacing PCB are present. As a result, CSP's and BGA's are the main types of packaging technology used in attaching semiconductors to PCB's.

As the demand for high speed, high performance, and low cost, semiconductor devices are continually increasing in integration density, packages have become more complex. For example, packages are present in which multiple chips are placed within a single package. These types of chips are also referred to as multi-chip modules. A multi-chip module (MCM), also referred to as a multi-chip package (MCP), contains two or more die in a single package. These multi-chip modules may contain microprocessor circuits along with peripheral circuits, such as memory management units, input/output controllers, peripheral component interconnect or interface (PCI) controllers, and application specific integrated circuits (ASIC).

In the integrated circuit world, high performance translates to high heat. This presents an additional problem that may become critical to the reliability of the package. By packaging multiple semiconductor devices in a single package the heating problem becomes more daunting.

The most common MCM is a "side-by-side" MCM. In this type of MCM, two or more die are mounted next to each other on the mounting surface of either a plastic molded package, cavity package, or a chip on board (COB) assembly. The die may be mounted directly to the mounting surface or be mounted on a substrate, which is itself mounted to the principle-mounting surface. Inner connections among these die and electrical leads are commonly made via wire bonding. Other MCM's involve placing two or more die on top of each other and securing the "stack" of die in a package. This may add additional reliability concerns as the upper die in the stack may be heated by the lower die.

One problem with placing multiple die within a single package is with additional die, additional possible defects are possible within the package. If one die within an MCM is defective, the entire chip must then be discarded. Thus, although MCM's have provided increased functionality, yields have decreased as a result of the increased chances for defects.

Thus, a need still remains for a ball grid array package stacking system. In view of the increasing demand for more circuit function in limited space, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a ball grid array package stacking system including: providing a base substrate; coupling an integrated circuit to the base substrate; coupling a stacking substrate over the base substrate; mounting a heat spreader, having an access port, around the base substrate and the stacking substrate; and coupling a stacked integrated circuit to the stacking substrate through the access port.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
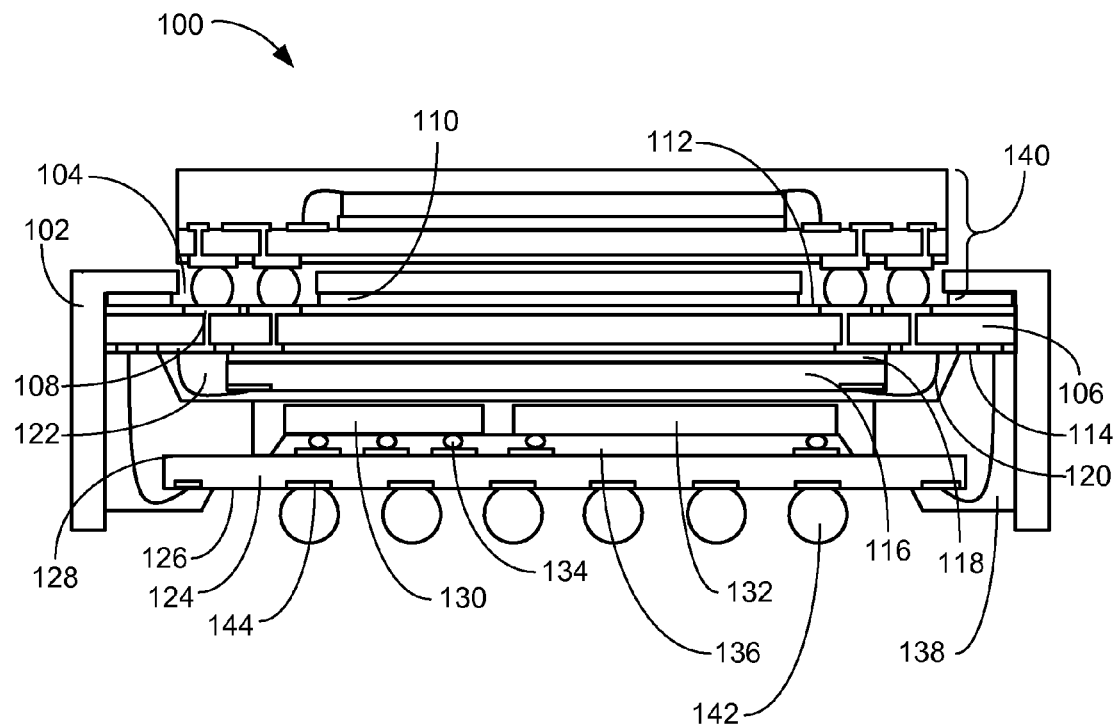
FIG. 1 is a cross-sectional view of a ball grid array package stacking system along a section line 1-1 of FIG. 2, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Figure 2:
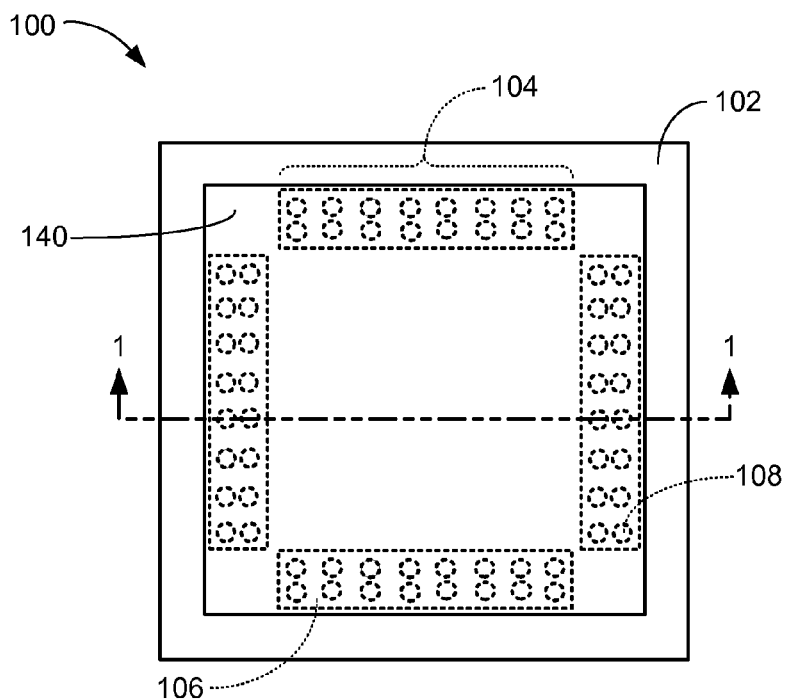
FIG. 2 is a plan view of the ball grid array package stacking system of FIG. 1.

Referring now to FIG. 1, therein is shown a cross-sectional view of a ball grid array package stacking system 100 along a section line 1-1 of FIG. 2, in an embodiment of the present invention. The cross-sectional view of the ball grid array package stacking system 100 depicts a heat spreader 102, such as an electrically and thermally conductive material, having access ports 104. A stacking substrate 106, such as a laminate substrate, a thin film substrate, a flex circuit substrate, or the like, may be positioned beneath the heat spreader 102 to align a connection pad 108 within the access ports 104. A thermal adhesive 110, such as a thermal epoxy or silica gel may be between the heat spreader 102 and the stacking substrate 106.

The stacking substrate 106 may have a stacking side 112 and a component side 114. An integrated circuit 116 may be mounted on the component side 114 by a chip adhesive 118, such as a die attach material. Electrical interconnects 120 may couple the active side of the integrated circuit 116 to the component side 114 of the stacking substrate 106. A molded cover 122, such as an epoxy molding compound, may be formed on the integrated circuit 116, the electrical interconnects 120, and the component side 114. This package structure may be electrically tested prior to further assembly in order to maximize the final product yield.

A base substrate 124 may have a system side 126 and a chip side 128. A first integrated circuit die 130, such as a flip chip integrated circuit, may be electrically connected to the chip side 128 of the base substrate 124. A second integrated circuit die 132, such as a wire bond type or flip chip type, may be positioned with an active side down and electrically connected to the chip side 128 by chip interconnects 134. The first integrated circuit die 130 and the second integrated circuit die 132 may be protected by a sealing material 136, such as an underfill material, the molded cover 122, or a combination thereof. The base substrate 124 with the first integrated circuit die 130 and the second integrated circuit die 132 may be electrically tested prior to further assembly in order to maximize the final product yield.

The stacking substrate 106 may be mounted over the base substrate 124. The electrical interconnects 120 may couple the system side of the base substrate to the component side 114 of the stacking substrate 106. A stacked package body 138 may be formed on the component side 114 of the stacking substrate 106, the base substrate 124, and the electrical interconnects 120.

A stacked integrated circuit 140 may be coupled to the stacking side 112 of the stacking substrate 106 by extending the chip interconnects 134 through the access port 104 in the heat spreader 102. The stacked integrated circuit 140 may be a ball grid array, a leaded chip carrier, a leadless chip carrier, discrete components, or a combination thereof.

System interconnects 142 may be coupled to contact pads 144 on the system side 126 of the base substrate 124. The heat spreader 102 may extend beyond the stacked package body 138 in order to provide a mechanism to limit the collapse of the system interconnects 142 during assembly of the next level system (not shown). The extension of the heat spreader 102 may be coupled to a supply voltage, such as ground, to supply a shield for electro-magnetic interference or radio frequency interference. The stacking substrate 106 and the base substrate 124 may provide an electrical connection between the stacked integrated circuit 140, the integrated circuit 116, the first integrated circuit die 130, the second integrated circuit die 132, the system interconnects 142, or a combination thereof.

Referring now to FIG. 2, therein is shown a plan view of the ball grid array package stacking system 100 of FIG. 1. The plan view of the ball grid array package stacking system 100 depicts the heat spreader 102 having the access port 104 positioned under the stacked integrated circuit 140. The stacking substrate 106 may be positioned under the heat spreader 102 with the connection pads 108 positioned in the access port 104. The section line 1-1 depicts the position and direction of view of the cross-sectional view of FIG. 1.

Figure 3:
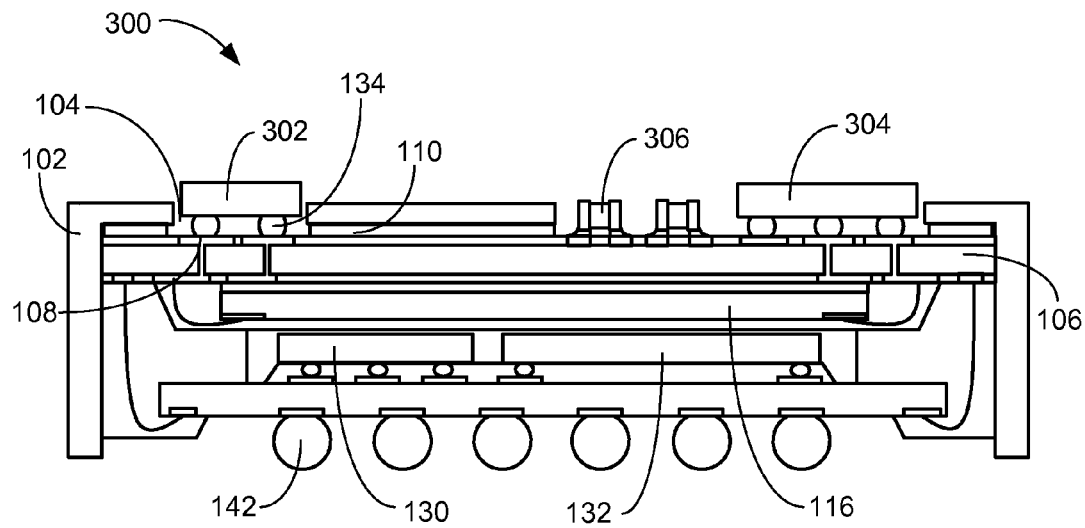
FIG. 3 is a cross-sectional view of a ball grid array package stacking system along a section line 3-3 of FIG. 4, in an embodiment of the present invention.
Figure 4:
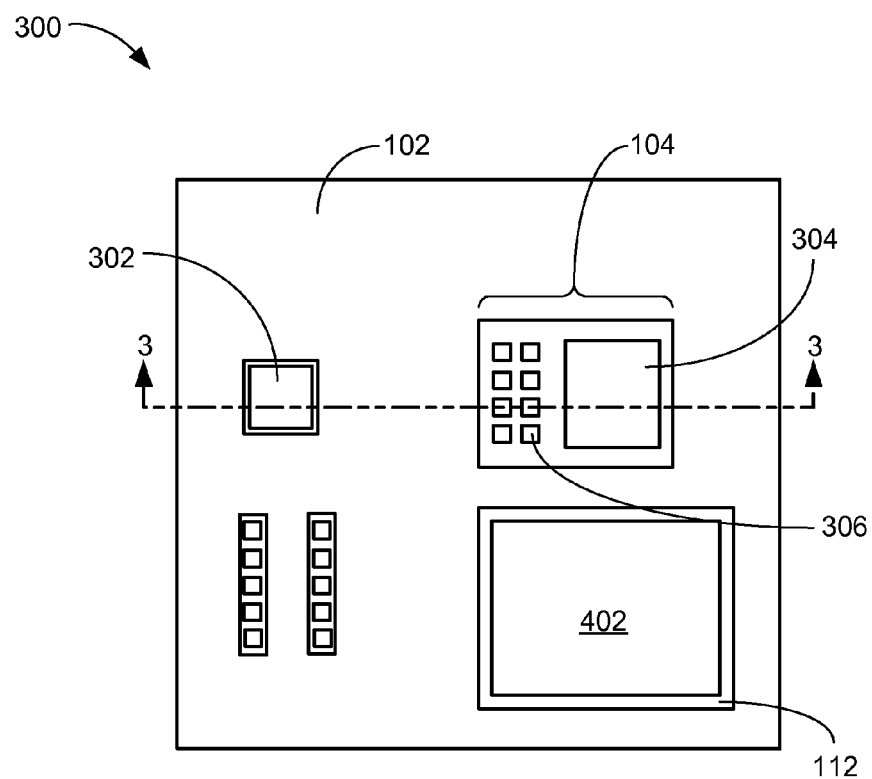
FIG. 4 is a top view of the ball grid array package stacking system of FIG. 3.

Referring now to FIG. 3, therein is shown a cross-sectional view of a ball grid array package stacking system 300 along a section line 3-3 of FIG. 4, in an embodiment of the present invention. The cross-sectional view of the ball grid array package stacking system 300 depicts the heat spreader 102 having the access ports 104 with the stacking substrate 106 coupled to an inside of the heat spreader 102.

The connection pads 108 on the stacking substrate 106 may be aligned with the access port 104 for stacking additional devices. A first stacked integrated circuit 302, such as a flip chip integrated circuit, a quad flat no-lead, a plastic leaded chip carrier, or the like, may be coupled to the connection pads 108 by the chip interconnects 134. A second stacked integrated circuit 304 may also be coupled to the connection pads 108.

The stacking substrate 106 may also support a discrete component 306, such as a resistor, a capacitor, an inductor, a voltage regulator, a diode, a transistor, or a combination thereof. The stacking substrate 106 may provide an electrical connection between the first stacked integrated circuit 302, the second stacked integrated circuit 304, the discrete component 306, the integrated circuit 116, the first integrated circuit die 130, the second integrated circuit die 132, the system interconnects 142, or a combination thereof.

Referring now to FIG. 4, therein is shown a top view of the ball grid array package stacking system 300 of FIG. 3. The top view of the ball grid array package stacking system 300 depicts the heat spreader 102 having the access ports 104. The first stacked integrated circuit 302 may be coupled to the stacking side 112 of the stacking substrate 106, of FIG. 1. The second stacked integrated circuit 304 may be mounted in the access port 104 adjacent to an array of the discrete component 306.

A third stacked integrated circuit 402 may be mounted in yet another of the access ports 104. Additionally other of the access ports 104 may be used for more of the discrete component 306. The configuration shown is for example only and any number of the first stacked integrated circuit 302 may be incorporated. As well the number and position of the discrete component 306 is an example only and the actual number and position may differ.

The section line 3-3 shows the position and direction of view of the cross-section in FIG. 3. It has been discovered that an efficient use of the heat spreader 102 may still allow multiple of the access ports 104 for further attachment of the first stacked integrated circuit 302, the second stacked integrated circuit 304, the third stacked integrated circuit 402, a number of the discrete component 306, or a combination thereof.

Figure 5:
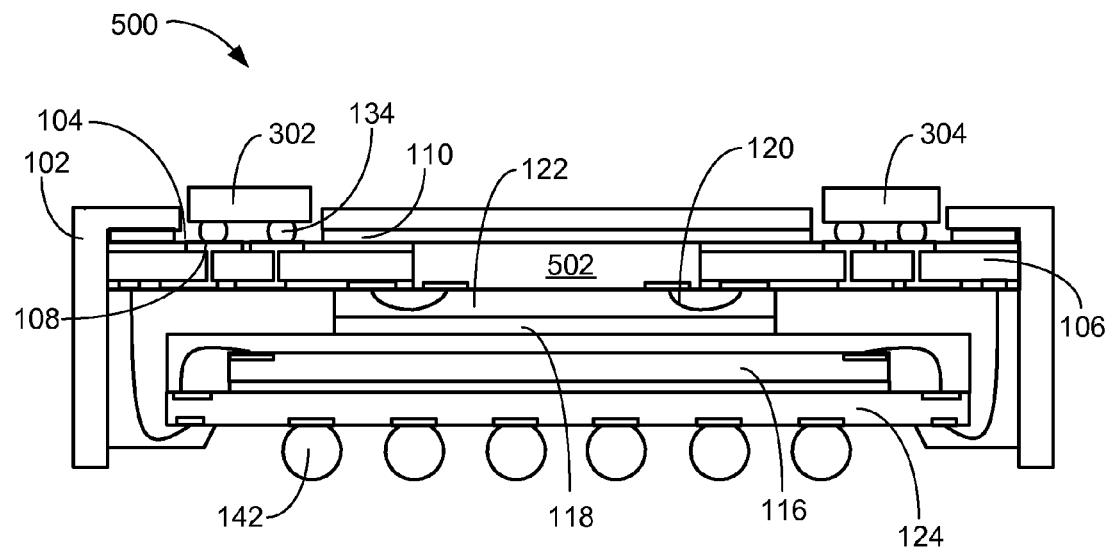
FIG. 5 is a cross-sectional view of a ball grid array package stacking system similar to FIG. 1, in an alternative embodiment of the present invention.

Referring now to FIG. 5, therein is shown a cross-sectional view of a ball grid array package stacking system 500, similar to FIG. 1, in an alternative embodiment of the present invention. The cross-sectional view of the ball grid array package stacking system 500 depicts the heat spreader 102 having the access ports 104 with the stacking substrate 106 coupled to the inside of the heat spreader 102 by the thermal adhesive 110.

The connection pads 108 on the stacking substrate 106 may be aligned with the access port 104 for stacking additional devices. The first stacked integrated circuit 302, such as a flip chip integrated circuit, a quad flat no-lead, a plastic leaded chip carrier, or the like, may be coupled to the connection pads 108 by the chip interconnects 134. The second stacked integrated circuit 304 may also be coupled to the connection pads 108.

The stacking substrate 106 may have an embedded integrated circuit 502. The embedded integrated circuit 502 may be coupled to the component side 114 of the stacking substrate 106 by the electrical interconnects 120. The molded cover 122 may be formed on the embedded integrated circuit 502, the electrical interconnects 120, and the component side 114 of the stacking substrate 106.

The integrated circuit 116 may be electrically connected to the base substrate 124 and encased by the molded cover 122. The molded cover 122 on the base substrate 124 may be joined to the molded cover 122 on the stacking substrate 106 by the chip adhesive 118. The combination of the stacking substrate 106 and the base substrate 124 may provide an electrical connection between the first stacked integrated circuit 302, the second stacked integrated circuit 304, the embedded integrated circuit 502, the integrated circuit 116, the system interconnect 142, or a combination thereof.

Figure 6:
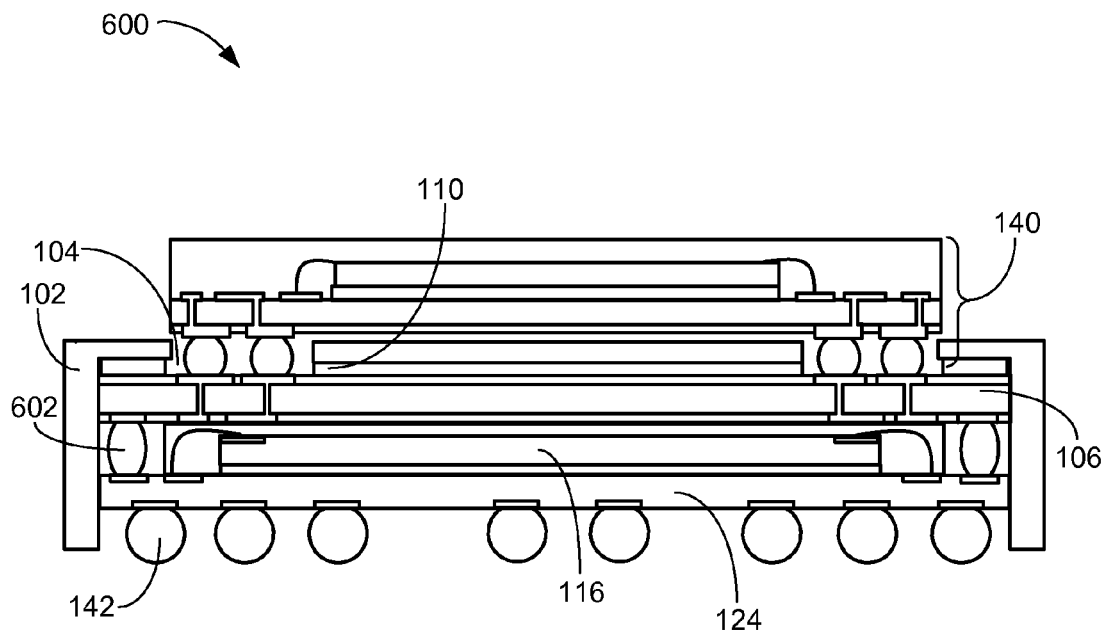
FIG. 6 is a cross-sectional view of a ball grid array package stacking system similar to FIG. 1, in a second alternative embodiment of the present invention.

Referring now to FIG. 6, therein is shown a cross-sectional view of a ball grid array package stacking system 600, similar to FIG. 1, in a second alternative embodiment of the present invention. The cross-sectional view of the ball grid array package stacking system 600 depicts the heat spreader 102 having the access ports 104 with the stacking substrate 106 coupled to the inside of the heat spreader 102 by the thermal adhesive 110.

The connection pads 108 on the stacking substrate 106 may be aligned with the access port 104 for stacking additional devices. The stacking substrate 106 may be coupled to the base substrate 124 by a substrate interconnect 602, such as a solder ball, a solder column, a solder bump, a stud bump, or a combination thereof.

The stacked integrated circuit 140 may be coupled to the connection pads 108, on the stacking substrate 106, through the access ports 104. By coupling the stacked integrated circuit 140 to the stacking substrate 106, an electrical connection may be formed between the stacked integrated circuit 140, the integrated circuit 116, the system interconnects 142, or a combination thereof.

Figure 7:
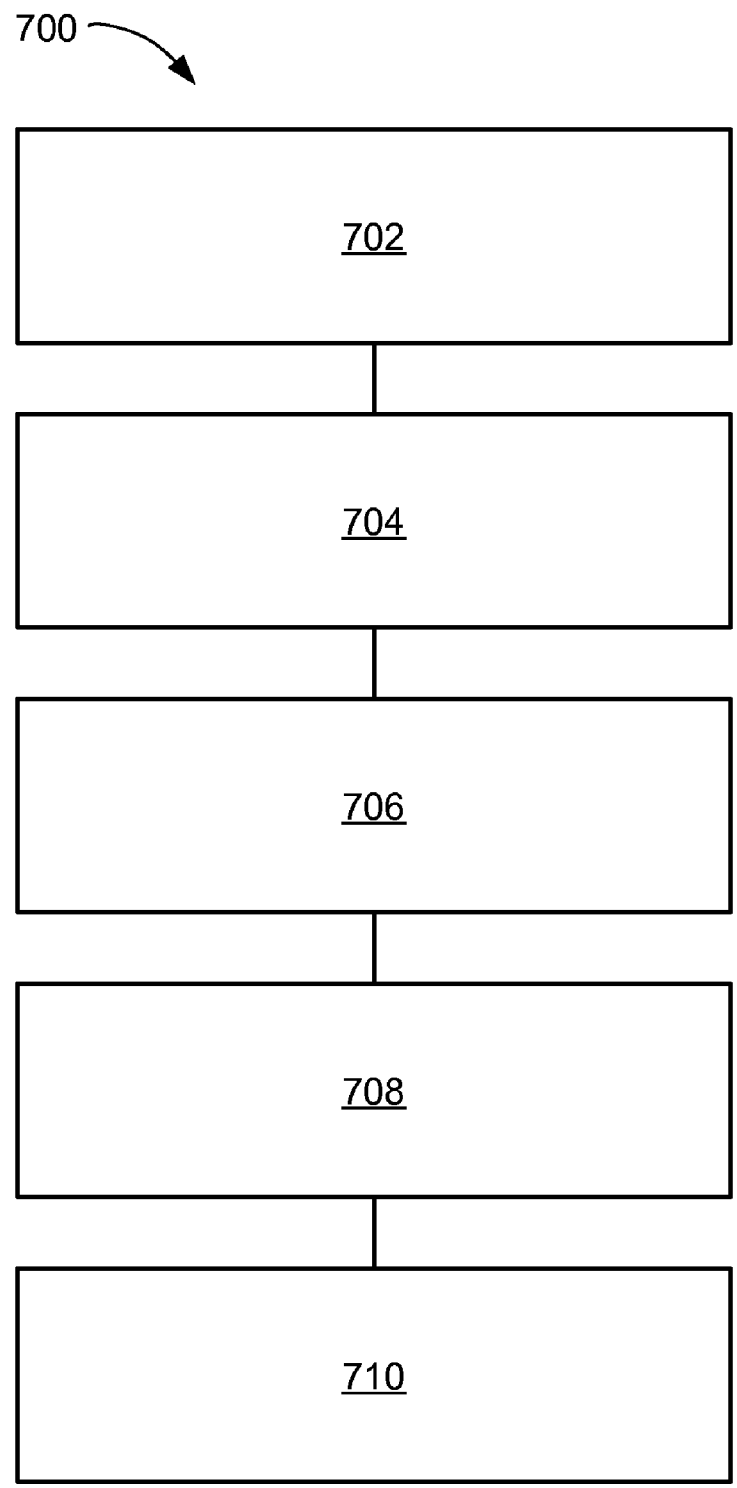
FIG. 7 is a flow chart of a ball grid array package stacking system for manufacturing the ball grid array package stacking system in an embodiment of the present invention.

Referring now to FIG. 7, therein is shown a flow chart of a ball grid array package stacking system 700 for manufacturing the ball grid array package stacking system 100 in an embodiment of the present invention. The system 700 includes providing a base substrate in a block 702; coupling an integrated circuit to the base substrate in a block 704; coupling a stacking substrate over the base substrate in a block 706; mounting a heat spreader, having an access port, around the base substrate and the stacking substrate in a block 708; and coupling a stacked integrated circuit to the stacking substrate through the access port in a block 710.

It has been discovered that the present invention thus has numerous aspects.

An aspect that has been discovered is that the present invention may provide multiple of the access ports without reducing the efficiency of the heat spreader.

Another aspect is the extension of the heat spreader beyond the package body may act as a stand-off to control the collapse of the system interconnects during attachment to the next level system. The extension of the heat spreader may be coupled to a supply voltage, such as ground, to supply a shield for electro-magnetic interference or radio frequency interference.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the ball grid array package stacking system of the present invention furnishes important and heretofore unknown and unavailable solutions, capabilities, and functional aspects for controlling heat in a stacked package while still allowing further attachment of additional packages or discrete components. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A ball grid array package stacking system comprising:
    a base substrate;
    an integrated circuit coupled to the base substrate;
    a stacking substrate over the base substrate;
    a heat spreader, having an access port, around the base substrate and the stacking substrate; and
    a stacked integrated circuit coupled to the stacking substrate through the access port.

2. The system as claimed in claim 1 further comprising a discrete component coupled to the stacking substrate, through the access port.

3. The system as claimed in claim 1 further comprising a stacked package body between the base substrate and the stacking substrate.

4. The system as claimed in claim 1 further comprising an electrical interconnect, a substrate interconnect, or a combination thereof between the base substrate and the stacking substrate.

5. The system as claimed in claim 1 further comprising a component side of the stacking substrate for coupling the integrated circuit mounted thereon.

6. The system as claimed in claim 1 further comprising:
a chip side and a system side on the base substrate;
a system interconnect coupled to the integrated circuit through the base substrate;
a chip adhesive between the stacking substrate and the base substrate;
a thermal adhesive between the stacking substrate and the heat spreader; and
a second stacked integrated circuit, a third stacked integrated circuit, or a combination thereof coupled through the access port.

7. The system as claimed in claim 6 further comprising a discrete component, to the stacking substrate, through the access port includes a resistor, a capacitor, an inductor, a voltage regulator, a diode, a transistor, or a combination thereof.

8. The system as claimed in claim 6 further comprising a stacked package body between the base substrate and the stacking substrate includes a molded cover on the base substrate, the stacking substrate, or a combination thereof encased.

9. The system as claimed in claim 6 further comprising an electrical interconnect, a substrate interconnect, or a combination thereof between the base substrate and the stacking substrate includes an embedded integrated circuit coupled to the stacked integrated circuit, the integrated circuit, the system interconnect, or a combination thereof.

10. The system as claimed in claim 6 further comprising a component side of the stacking substrate for coupling the integrated circuit mounted thereon includes a molded cover formed on the integrated circuit, an electrical interconnect, and the component side of the stacking substrate.

* * * * *